United States Patent [19]

Breslow

[11] 4,360,730
[45] Nov. 23, 1982

[54] ENCODER ALIGNMENT METHOD AND APPARATUS

[75] Inventor: Donald H. Breslow, Framingham, Mass.

[73] Assignee: Itek Corporation, Lexington, Mass.

[21] Appl. No.: 197,646

[22] Filed: Oct. 16, 1980

[51] Int. Cl.³ .............................................. G01D 5/36
[52] U.S. Cl. ............................ 250/231 SE; 340/347 P
[58] Field of Search ..................... 250/231 SE, 237 G; 356/395; 324/175; 340/347 P

[56] References Cited

U.S. PATENT DOCUMENTS

4,182,953  1/1980  Hurley, et al. ................ 250/231 SE

Primary Examiner—David C. Nelms
Assistant Examiner—Darwin R. Hostetter
Attorney, Agent, or Firm—Homer O. Blair; Robert L. Nathans; Gerald H. Glanzman

[57] ABSTRACT

A test assembly is provided for decreasing the skill and time required for aligning the code detector unit with an optical encoder disc. The output signals from the encoder assembly are conditioned to remove DC offset and to balance the amplitudes of the signals. The conditioned signals are used to generate a staircase display on an oscilloscope by weighting the signals and summing them in parallel circuits to provide parallel multiphase signals. Those signals are converted to square waves which are summed to provide the staircase. The timing of the staircase is indicative of the phase relationships of the multiphase signals. The relationship of those signals is in turn dependent on the phase relationship of the output signals from the code detector.

11 Claims, 12 Drawing Figures

Fig. 6 a) SIN b) <36° c) <72° d) <108° e) <144° f)

ENCODER ALIGNMENT METHOD AND APPARATUS

DESCRIPTION

TECHNICAL FIELD

This invention relates to the alignment of angular position encoders and associated code readers to provide for proper readout. The invention has particular application to the alignment of photodetectors and fixed aperture slit plates with respect to a light source and an optical code disc.

BACKGROUND ART

Figure 1:
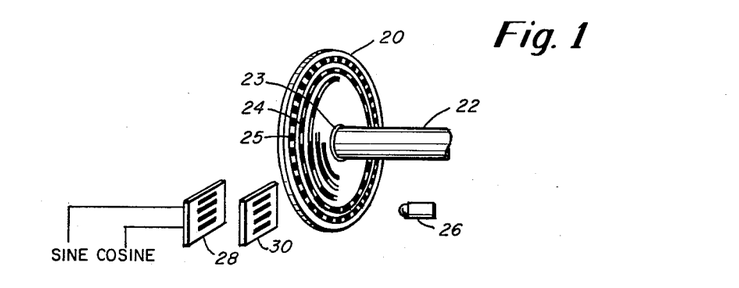
FIG. 1 is an illustration of a typical optical encoding system.

FIG. 1 illustrates a typical optical encoding system. A code disc 20 is mounted to an encoder shaft, the angular position of which is to be monitored. The disc is generally glass and has a series of concentric annular code tracks inscribed thereon. Each track comprises alternate transparent and opaque segments defining equal parts around the shaft 22. The number of code cycles per track may vary from one cycle on the coarsest track 23 to several thousand cycles on the outer fine track 25. The actual angular position of the code disc can be determined from the instantaneous binary states of several code tracks.

In FIG. 1, the optical code reading system is shown for the fine track, it being understood that each track is similarly read. The track is illuminated by a light emitting diode (LED) 26. The thus illuminated transparent and opaque segments of the track are viewed by photodetectors 28 through precision optical slits 30. An instantaneous photodetector output is dependent on whether transparent or opaque segments are aligned with the photodetectors and their associated slits. The detectors associated with other than the finest track provide square wave outputs as the disc rotates, and together the outputs from several tracks represent a binary code.

Figure 2:
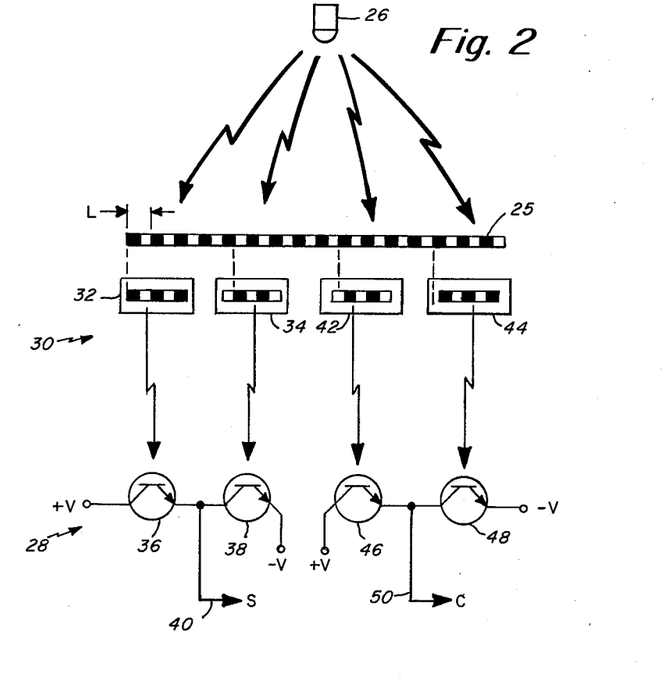
FIG. 2 is a more detailed illustration of the optical code detection of the fine track of the system of FIG. 1.

The segments on the fine track are so closely spaced that they form a diffraction grating which provides for high fidelity sinusoidal photodetector outputs as the code disc rotates. The photodetector circuit providing the sinusoidal output is shown in FIG. 2. Selected signals are shown plotted against angular position in FIG. 3.

Figure 3:
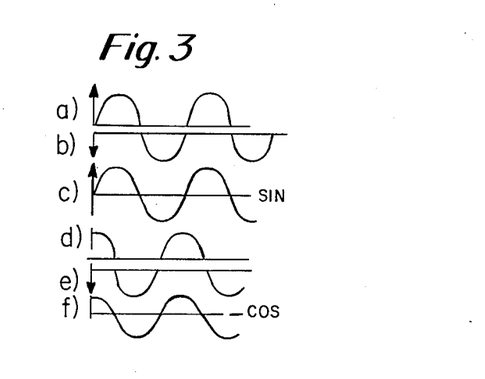
FIG. 3 is a graphical illustration of selected electrical currents in the detector circuitry of FIG. 2 plotted against angular position of the code disc.

To provide a first sinusodial output, designated the sine signal, two groups of slits 32 and 34 are precisely aligned with respect to the fine track 25 such that each is spaced a number of cycles plus 180 cycle degrees from the other. The detectors associated with the slits 32 and 34 are phototransistors 36 and 38 connected in a push-pull configuration. As shown, the slits 32 are aligned with transparent segments of the fine track 25; thus the transistor 36 conducts. On the other hand, the slits 34 are 180° out of phase with respect to slits 32 and are aligned with opaque segments so that the transistor 38 does not conduct. As the code disc rotates, the two transistors 36 and 38 are illuminated alternately to provide outputs as shown in FIGS. 3a and 3b. The resultant output on line 40 is a sinusoid as shown in FIG. 3c.

To provide a cosine signal, two groups of slits 42 and 44 are positioned a number of cycles plus 90° from respective slit groups 32 and 34. As a result, cosine detector transistors 46 and 48 are illuminated to provide the combined output on line 50 illustrated in FIG. 3f. It can be seen that the cosine signal on line 3f is advanced 90 cycle degrees from the sine signal of FIG. 3c.

The sine and cosine signals on lines 40 and 50 are processed to provide a position indication of a high resolution. That resolution would not be possible with a simply binary readout of the fine track 25. To that end, Sidney Wingate has shown in U.S. Pat. Nos. 3,310,798 and 3,312,838 that two square waves of the same frequency but out of phase can be logically combined, as in an exclusive-OR gate, to provide a new square wave of twice that frequency. If that signal having twice the frequency is then logically combined with a similar but out of phase signal, a signal having four times the frequency of the original signals can be provided. The multiple phase shifting necessary in such a method is provided by summing weighted sine and cosine signals from lines 40 and 50. The resultant phase shifted sinusoids are then converted to square waves for the logical combination noted above.

It is extremely important that the sinusoidal outputs on lines 40 and 50 have a precise phase relationship, equal amplitudes and no DC bias. If the phase relationship for which the signal weighting and summing electronics have been designed is not maintained, the phase shifted outputs from the electronics are distorted. On the other hand, the fine track may comprise black and white segments of no more than 10 microns (400 microinches) in length. With spacing of the code disc and detector optics necessary for free rotation of the disc, any minute misalignment of the mechanical components may result in a large distortion of the sine and cosine signals as to amplitude, DC offset and relative phase.

In the past, alignment of the photodetector and slit optics with respect to the LED and disc has been made by a highly skilled technician. The technician observes the output from the fine track on an oscilloscope as the code disc rotates. He switches the oscilloscope inputs for both sinusoidal signal displays and a Lissajous pattern display, an indication of the phase relationship of the signals. The technician must tap the detector and slit optics lightly in an effort to move them to a position which provides the desired oscilloscope displays. After moving the optics, the technician must adjust the oscilloscope gain and DC offset for each of the sinusoidal signals and then observe the Lissajous pattern to ascertain whether the movement of the detector and slit optics resulted in the desired phase relationship. In aligning optics with respect to discs having very fine code tracks, this procedure is extremely tedious and requires great skill in adjusting and reading the oscilloscope and in properly tapping the optics.

A primary object of this invention is to provide means for reducing the skill and time required to align code discs with associated code reading optics.

SUMMARY OF THE INVENTION

In accordance with the invention, a circuit is provided to condition the signals from an encoding system to a display, such as an oscilloscope, during an alignment. The signals differ only in phase relationship because the amplitudes are balanced and the DC offsets are removed by the conditioning electronics. As a result, the technician need only be concerned with the phase relationship as he repositions elements of the encoder system. He need not adjust the display controls. Once the phase relationship is established, other imbalances in the signals can be corrected during use by the usual electronics associated with the encoding system.

In a preferred form of the invention, a digital staircase readout on an oscilloscope provides a clear indication of the phase relationship of the two sinusoids, even to an inexperienced technician. Preferably, the display is obtained by weighting and summing the conditioned sinusoids and squaring the resultant signals to provide a number of phase shifted digital signals. Those digital signals are then summed, and the sum signal is applied to the oscilloscope. The sinusoids are weighted to provide a predetermined display only if the sinusoids are exactly 90° out of phase. Preferably the proper display is of symmetric staircases of constant step sizes. Any shifting in the phase relationship from 90° results in an improper vectorial combination of the sinusoids with summation. The display is distorted, being neither symmetric nor of equal steps.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED EMBODIMENTS

Figure 4:
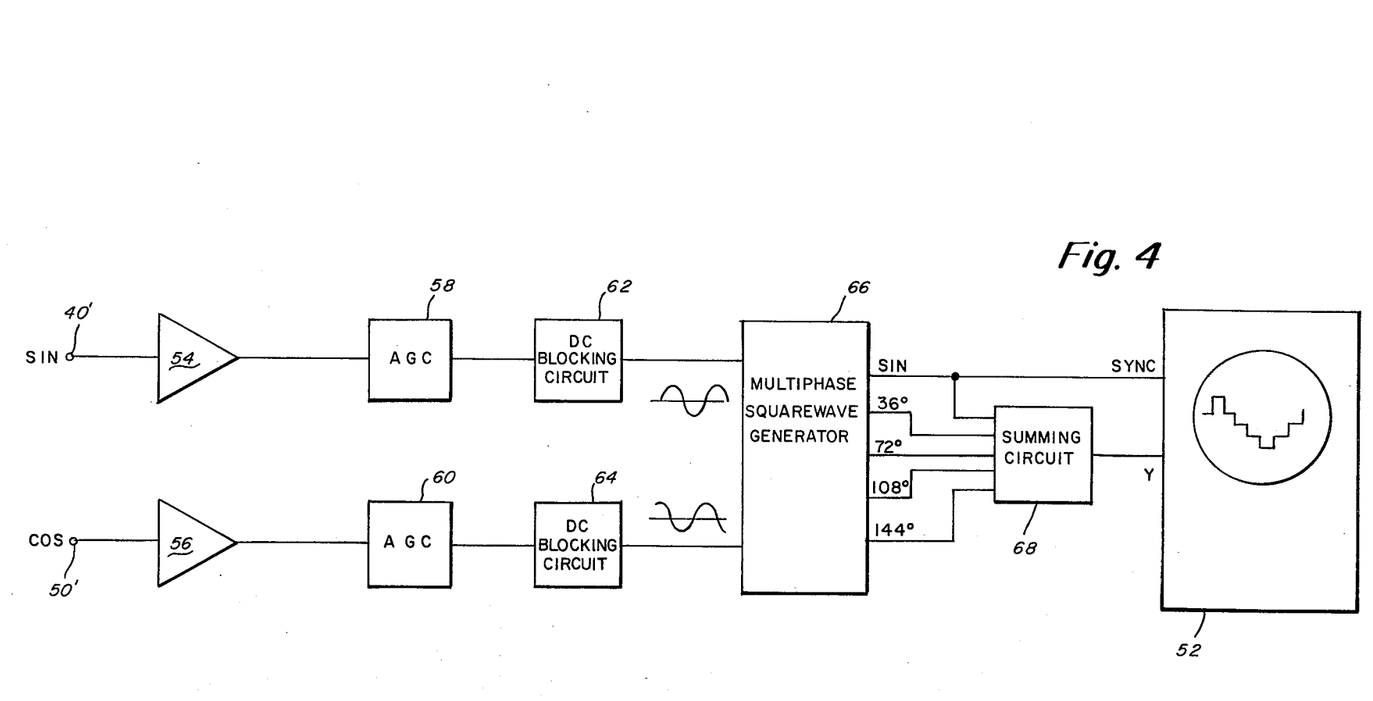
FIG. 4 is an electrical block diagram of a signal conditioning circuit embodying this invention.

During an alignment procedure of an encoder system, rather than applying the sine and cosine outputs directly to the X and Y inputs of an oscilloscope 52, as in the usual case, the signals are processed in the circuit of FIG. 4, and the processed signals are applied to the Y input of the oscilloscope.

In the circuit of FIG. 4, the signals are first preamplified in preamplifiers 54 and 56 from the usual five to ten millivolt detector level to an amplitude of between one and five volts peak. Those preamplified signals are then applied to automatic gain control circuits 58 and 60 which establish predetermined peak to peak swings in the signals, the phase relationship of the signals remaining intact. The signals are then applied to DC blocking circuits 62 and 64 for removing any DC offset in either signal. Preferably, the DC blocking is by means of a simple AC coupling circuit, but an automatic bias amplifier may also be used.

The thus conditioned sine and cosine signals are then applied to a parade generator which includes a multiphase square wave generator 66 and a summing circuit 68. The multiphase square wave generator is similar to those used in conventional decoding electronics for providing increased resolution from the fine code track. If the conditioned sine and cosine signals applied to the generator 66 are exactly 90° out of phase, additional signals advanced from the sine wave by 36° 72°, 108°, and 144° are provided. The sine wave and advanced sinusoids are converted to square waves by the generator 66 and are applied to a summing circuit. The summing of the multiphased square waves provides a staircase output which can be seen on the oscilloscope 52.

Figure 5:
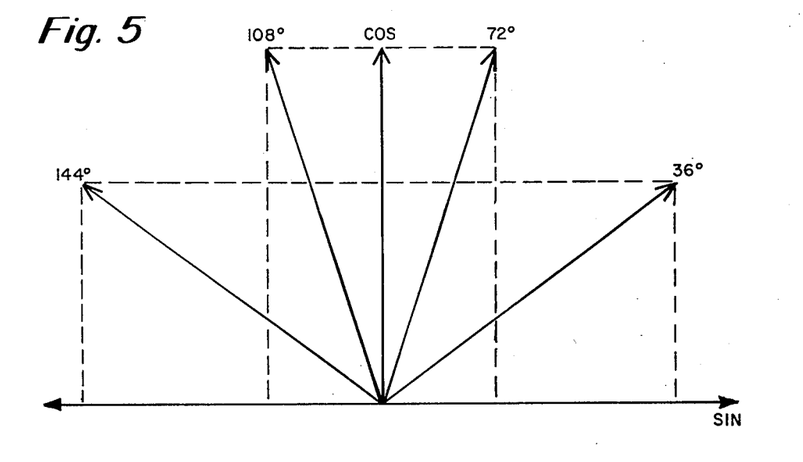
FIG. 5 is a graphical illustration of the weighting and summing of sine and cosine signals in the signal conditioning circuit of FIG. 4 where the sine and cosine signals have a proper 90° phase difference.
Figure 6:
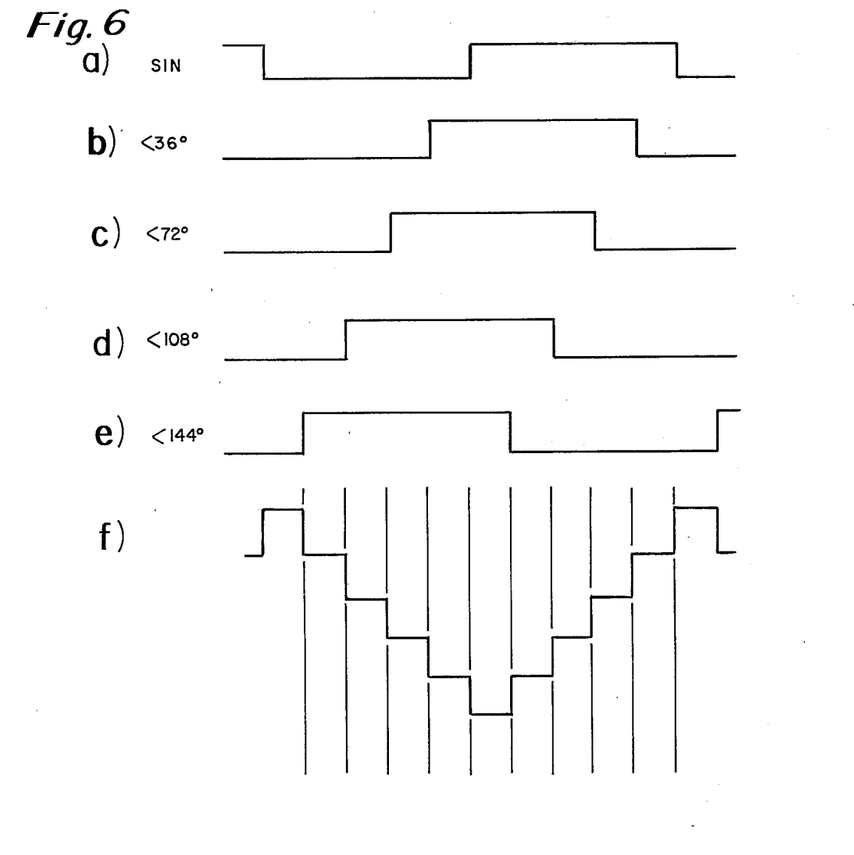
FIG. 6 is a timing chart of the several output signals from the phase shift and digitizing circuit and from the summing circuit of FIG. 4 where the sine and cosine signal are as in FIG. 5.

The operation of the parade generator can be better understood with reference to FIGS. 5 and 6. FIG. 5 shows the sine and cosine vectors with a proper 90° phase difference between them. Those two vectors are applied to the multiphase square wave generator 66 and, in parallel circuits, are weighted and combined to provide the four additional sinusoids in advance of the sine wave by 36°, 72°, 108° and 144°. Square waves at those angles are illustrated in FIGS. 6b–e. With those signals then added together and inverted, they provide the dual staircase output indicated in FIG. 6f.

The particular phase angles of the several signals were selected so that the signal of FIG. 6f can be readily aligned with the typical ten-segment grating on an oscilloscope screen. Thus, if true sine and cosine waves, phase offset by 90°, are processed through the circuit of FIG. 4, the display is symmetric and each of the equal steps is aligned with the grating of the display.

Figure 7:
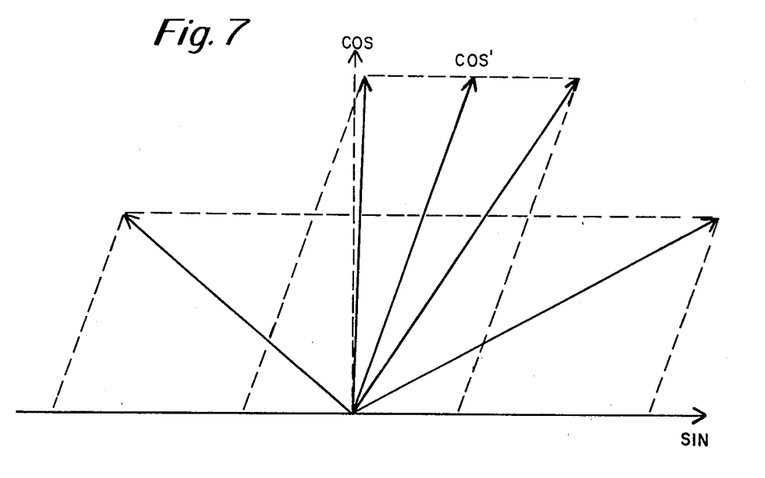
FIG. 7 is a graphical analysis of the weighting and summing of two sinusoids in the circuit of FIG. 4 where there is less than a 90° phase shift between 4 where there is less than a 90° phase shift between the two signals.
Figure 8:
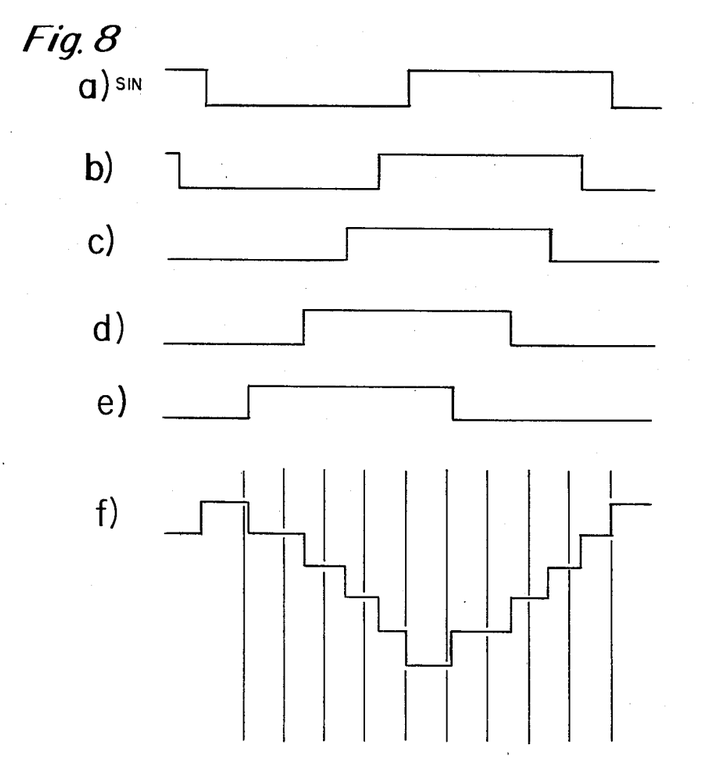
FIG. 8 is a timing chart similar to FIG. 6 but for the situation of FIG. 7.

If the second signal is not truly a cosine signal at 90° from the sine wave, the result may be as illustrated in FIGS. 7 and 8. In FIG. 7 a signal cos' is combined vectorially with the sine signal. But the weighting of the sine and cos' signals in the multiphase square wave generator is such that only truly orthogonal signals will lead to signals phase shifted equally at 36°. With that weighting of the sine and cos' signals, it can be seen that the resultant four sinusoids are at phase angles other than those predicted for a proper signal.

The summation of the resultant square waves of FIGS. 8a–e is as shown in FIG. 8f. It can be seen that the staircase generated is not symmetrical and the steps are not of equal width. As a result, the staircase display cannot be aligned with the oscilloscope grid. This is an indication that the signals from the encoding system are not in proper phase relationship and that the detector hardware should be shifted in position. It is clearly the improper phase relationship which causes the display distortion—the amplitude and DC imbalances having been removed electronically.

Figure 9:
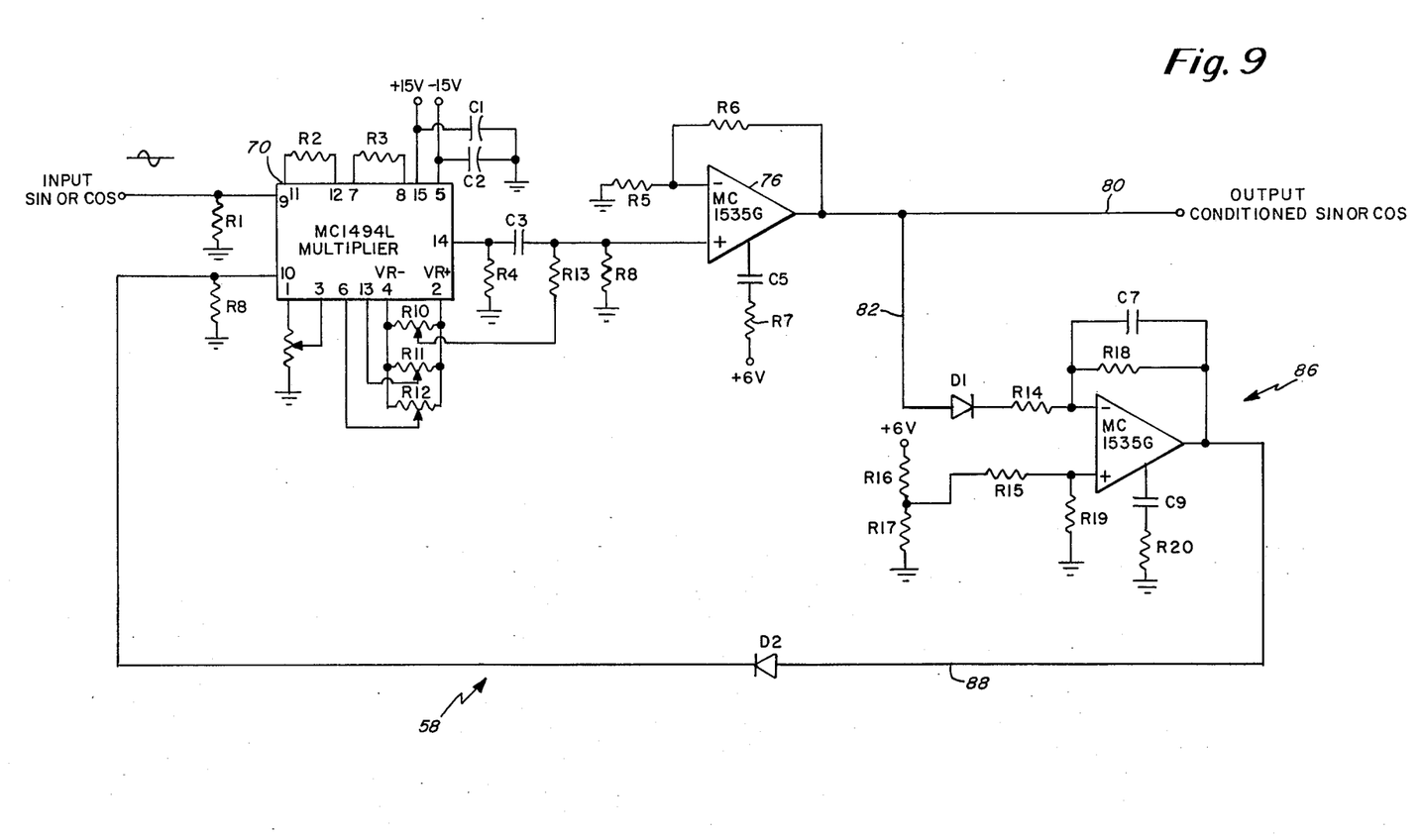
FIG. 9 is a detailed electrical schematic diagram of an automatic gain control and DC blocking circuit for use in the circuit of FIG. 4.

One of the automatic gain control and DC blocking circuits 58, 62 and 60, 64 is shown in detail in FIG. 9. The circuits shown separately in FIG. 4 as automatic gain control and DC blocking are merged into a single circuit. The sine or cosine signal from amplifier 54 or amplifier 56 is applied to pin 9 of an MC 1494L multiplier 70. That signal is multiplied by an automatic gain control signal applied to pin 10. Initially, the signal at pin 10 is set at about one volt DC so that the sinusoidal input (pin 9) passes through to output pin 14. The signal is then applied through an AC coupling circuit including capacitor C3 and resistor R8 to remove any DC from the signal. The DC balance at the input to an amplifier 76 is maintained by a potentiometer R10 positioned between positive and negative voltage reference pins 2 and 4 of the multiplier. The signal from amplifier 76 is applied through output lead 80 to the multiphase square wave generator 66.

Automatic gain control is provided by a feedback loop from lead 82. The positive portion of the sine wave, with zero DC offset, is applied through diode D1 to an integrator 86. Integrator 86 has an RC time constant which is long compared with the encoder cycle frequency at the alignment rotation speed but short compared with the time required to realign a detector station. The integrator output is fed back to the multiplying input at pin 10 of the multiplier 70.

So long as the preamplifier signal is within a proper voltage range, the feedback loop including integrator 86 drives the multiplier 70 to provide a signal on line 80 of a predetermined peak value. For example, if the amplitude level at the input drops with movement of the detector station, the signal on line 80 also drops. That signal is applied to the inverting input of the integrator 86 so that the output of the integrator on line 88 increases. The increased voltage on line 88 increases the gain of the multiplier 70 to provide an increased output on line 80 and the signal on line 80 levels off to the predetermined amount. Similarly, if the input at pin 9 of multiplier 70 increases, the signal on line 80 increases and the output of integrator 86 decreases. Thus the gain of the multiplier 70 also decreases to bring the signal on line 80 back down to the predetermined level.

It can be seen from the above that the output on line 80 has had any DC offset in the signal removed by the AC coupling of resistor R4 and capacitor C3, and the output has a predetermined amplitude due to the feedback to the multiplier 70 through the integrator 86.

Figure 10:
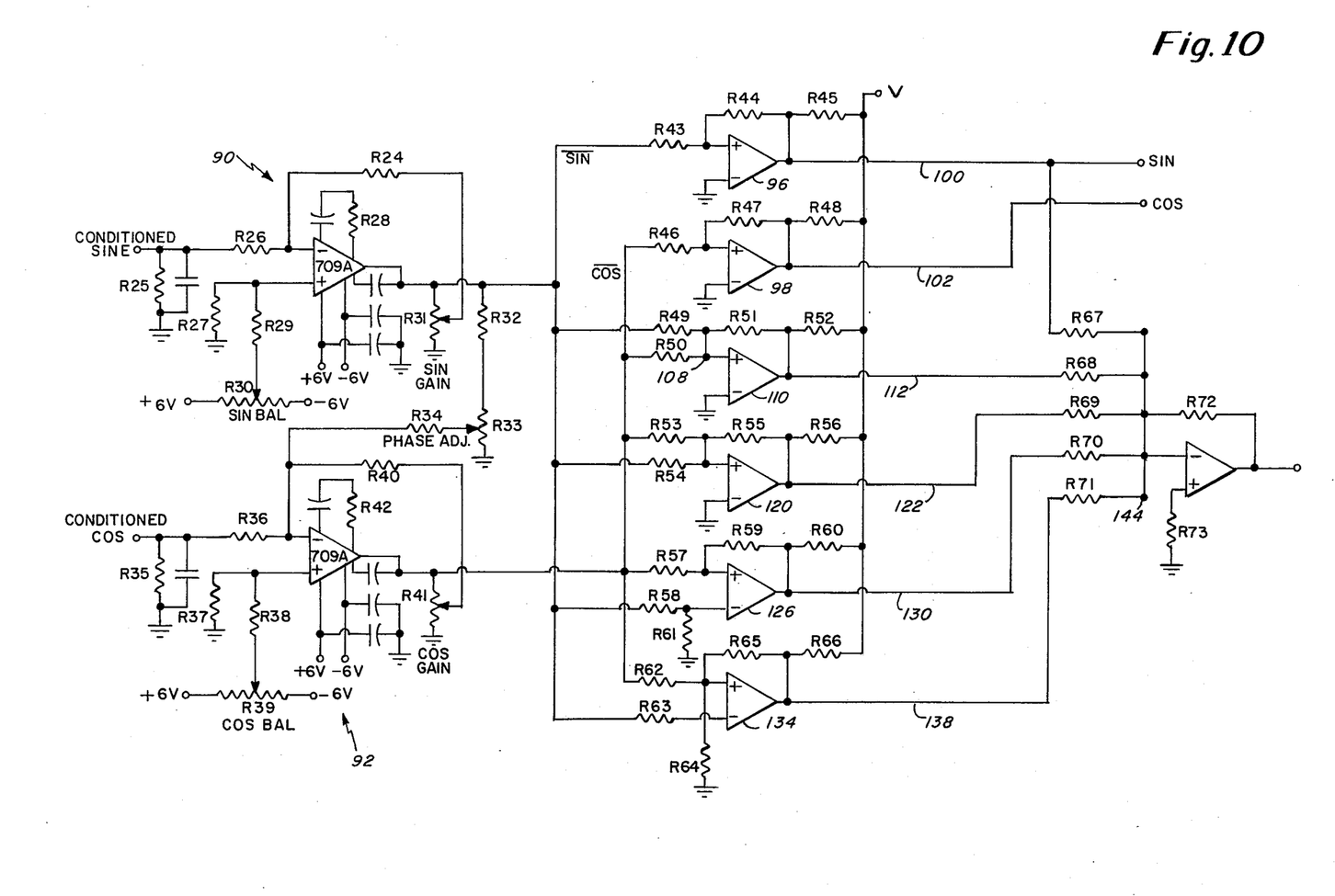
FIG. 10 is a detailed electrical schematic diagram of the phasing and summing circuits of FIG. 4.

The conditioned sine and cosine signals from the automatic gain control and blocking circuits are applied to the parade generator including the multiphase square wave generator 66 and summing circuit 68, shown in detail in FIG. 10. The multiphase square wave generator 66 is substantially the same as such generators in the encoding electronics associated with installed optical encoder systems. It includes a sine wave amplifier 90 and a cosine wave amplifier 92. The amplified sine and cosine signals, inverted, are applied to a group of parallel analogue weighting, summing and wave squaring circuits 94. Inverting the two signals simply advances the sine and cosine and the resultant signals 180° and inverts the final output without affecting the symmetry of the output.

The sign and cosine signals are passed directly through comparators 96 and 98 to provide squared sine and cosine signals on lines 100 and 102. To provide a square wave advanced 36° from the sine wave, when the sine and cosine signals are actually orthogonal, the signals are weighted by respective resistors R49 and R50 and summed at node 108. That summed signal, which is the resultant vector of the two weighted signals, is applied to comparator 110 to provide the desired square wave output on line 112. Similarly, to provide a 72° advance from the sine wave with orthogonal sine and cosine signals, the two signals are weighted by resistors R53 and R54 and summed at node 118. The resultant signal is applied to the comparator 120 to provide a square wave output on line 122.

To provide the 108° advanced wave, it can be seen from FIG. 5 that a portion of the negative of the sine vector must be added to a portion of the cosine vector. To that end, the cosine signal is weighted by resistor R57 and applied to the non-inverting input of comparator 126; whereas, the sine signal is weighted by resistor R58 and applied to the inverting input of comparator 126. The output 130 from the comparator 126 is a square wave advanced 108° from the sine wave if the sine and cosine are truly orthogonal. Similarly, the cosine signal is weighted by resistor R62 and applied to the noninverting input of comparator 134, and the sine wave is weighted by resistor R63 and applied to the inverting input of comparator 134. The resultant square wave, advanced 144° with respect to the sine when sine and cosine are orthogonal, is on line 138.

The signals found on respective lines 100, 112, 122, 130 and 138 when the system is aligned are shown in FIGS. 6a-e. Each of those square waves is applied through a bank of input resistors 140 to the inverting input of operational amplifier 142. The final output of summing circuit 68 is thus as shown in FIG. 6f. In that figure the output of the summing circuit is displayed over the gratical marks of the oscilloscope, each step of the staircase display being in line with the graphical marks. The technician thereby recognizes that the detector assembly has been aligned to provide a proper phase relationship between the sine and cosine signals.

The weighting resistors in circuit 94 are of values selected to provide the desired phase angles if the sine and cosine signals applied to the circuit are truly orthogonal. Where those signals are not orthogonal, as shown in FIG. 7, that weighting of the input signals is not the weighting necessary to provide the desired phase angles. Rather, as shown in FIG. 7, that weighting provides signals, which, in this case, are retarded in phase angle from what one would expect with an orthogonal input. When those retarded signals are summed by summing circuit 68 and the output of the circuit is displayed on the oscilloscope, it can be seen in FIG. 8f that the display is shifted off of the gratical marks on the oscilloscope. Also, the display is not symmetrical and the steps are not of equal width. Thus the technician knows immediately that the detector assembly must be moved to further advance the cosine signal.

The symmetrical staircase display is particularly suitable for observing the phase relationship of the sine and cosine outputs from the encoding system. The digital nature of the display allows for alignment of the signal with graticals on a conventional oscilloscope. Thus, one can provide a simple circuit card to a customer who wishes to align his own system or to a technician employed by the manufacturer. With the card connected between the encoding system and oscilloscope, either individual can make quick and advantageous use of this invention. No special display apparatus or mechanical unit is required.

Other displays which show the phase relationship between a conditioned signal and a desired signal may also be used. In any case, it is important that deviations in amplitude and DC offset in the encoder output not be a factor in judging the alignment of the system. In this system the automatic gain control and DC blocking circuits serve this function. Once the phase relationship is established, the decoding electronics associated with the encoder system can be adjusted to correct for amplitude imbalance and DC offset in a conventional fashion.

The present invention not only provides an indication of whether the sine and cosine signals applied through the oscilloscope are orthogonal. The system also provides an indication of the total fidelity of the signal. Any distortions in the sine or cosine signals will affect the weighted summation of the waves and will thus affect the display on the oscilloscope.

Figure 11:
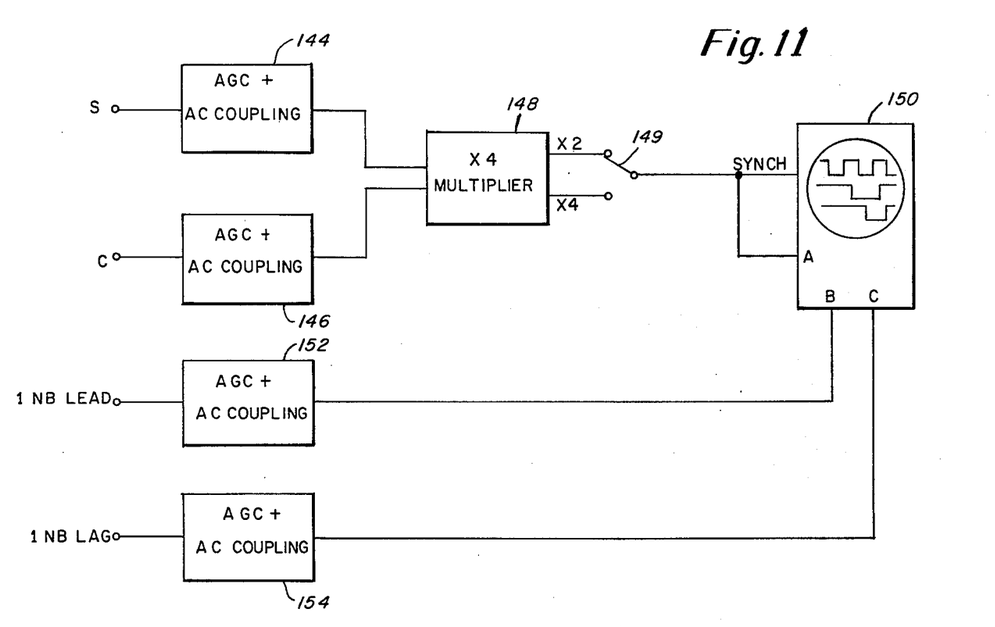
FIG. 11 is an electrical block diagram of an alternative embodiment of the invention with which phase fidelity of two adjacent V-scan tracks can be determined.

The system described above has been designed to monitor the fidelity of a single fine track. The system can also be used to monitor the phase relationship of two adjacent tracks. A system designed for that purpose is shown in FIG. 11. As shown in the system of that figure, the sine and cosine signals from the fine track are conditioned in respective automatic gain control and AC coupling circuits 144 and 146. The thus conditioned signals, properly phased by the alignment procedure using the system of FIG. 4, are applied to a coventional X4 multiplier 148. The multiplier squares the sine signal to provide a X2 output. It also squares the cosine signal, and the squared sine and cosine signals are exclusive-OR gated to provide the X4 signal. The X4 signal is a squarewave having a frequency twice that of the X2 signal. Either signal can be selected by switch 149 as the synchronization and first channel input to a three channel oscilloscope 150. Alternatively, a X2 multiplier may be used with only that signal available as the synchronization signal and first channel input.

Figure 12:
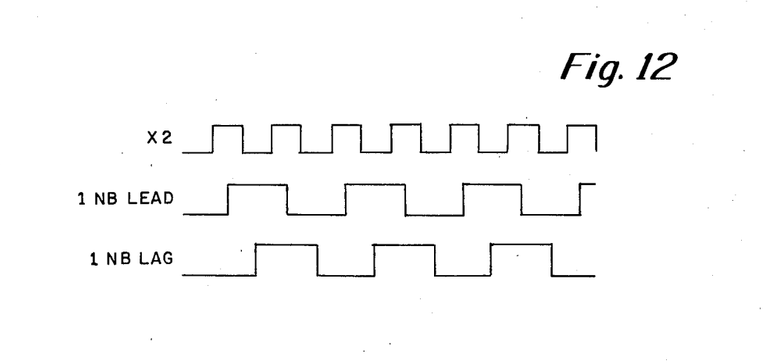
FIG. 12 shows a phase relationship display.

The first channel display on the oscilloscope provides a reference for square waves received from respective conditioning circuits 152 and 154. 1 NB lead and 1 NB lag are usual V scan signals derived from the first code track adjacent the fine track. They are here conditioned in the automatic gain control and AC coupling circuits 152 and 154 and are applied to the second and third channel inputs of the oscilloscope 150. The phase relationship of the lead and lag signals relative to the X2 and X4 input can be determined from the display as shown in FIG. 12.

By applying conditioned signals from other tracks through suitable multiplier circuits to increase the signal frequencies, those signals can also be compared to the fine track signal in the same way.

While the invention has been particularly shown and described with reference to preferred embodiments thereof, it will be understood by those skilled in the art that various changes in form and details may be made therein without departing from the spirit and scope of the invention as defined by the appended claims.

I claim:

1. A test assembly for testing the alignment of an angular position encoder and a code detector unit comprising:
   an angular position encoder to be tested;
   means for rotating the angular position encoder;
   circuit means including signal conditioning circuitry for receiving at least two outputs from the angular encoder, those outputs having a predetermined phase relationship when the encoder and detector are aligned, the circuitry including means for removing the DC offset from each of the signals and for balancing the amplitudes of the signals with respect to each other; and
   display means for receiving the conditioned signals and providing a display indicative of the phase relationship of the condition signals.

2. A test assembly as claimed in claim 1 wherein the display is a digital display.

3. A test assembly as claimed in claim 2 wherein the display is a staircase display.

4. A test assembly as claimed in claim 3 wherein the circuit means further includes a staircase generator comprising:
   a plurality of parallel circuits for weighting and summing sinusoidal inputs from the signal conditioning circuitry;
   means for converting the summed signals to square waves; and
   means for summing the square waves to provide a staircase signal.

5. An optical encoder test assembly for testing the alignment of an optical encoder disc and a code detector unit, the test assembly comprising:
   an optical encoder disc and code detector assembly;
   means for rotating the encoder disc;
   circuit means including signal conditioning circuitry for removing the DC offset from code detector output signals and for balancing the relative amplitude of the code detector signals;
   digital display generating circuitry; and
   an oscilloscope for displaying the output of the digital display circuitry.

6. A test assembly as claimed in claim 5 wherein the digital display circuitry generates a staircase signal, the timing of the staircase steps being indicative of the phase relationship of the code detector signals.

7. A test assembly as claimed in claim 6 wherein the staircase generating circuitry comprises parallel circuits for weighting and summing sinusoidal inputs from the signal conditioning circuitry, means for converting the summed signals to square waves, and means for summing the square waves.

8. A circuit for conditioning input signals from an optical encoder assembly and generating a staircase display indicative of the phase relationship of the input signals, the circuit comprising:
   automatic gain control and DC blocking circuitry for removing the DC offset of each of the input signals and balancing the amplitudes of the signals;
   parallel circuits for weighting and summing the conditioned signals and for converting the summed signals to square waves; and
   means for summing the square waves to provide the staircase signal.

9. In a method of aligning an optical angular encoder disc and a code detector by rotating the encoder disc, providing output signals from at least two detector elements in the detector unit, determining the phase relationship between the output signals and adjusting the relative position of the detector unit to obtain a predetermined phase relationship between the output signals, the improvement of determining that phase relationship by:
   applying the output signals to automatic amplitude control and DC blocking circuits to provide conditioned signals; and providing a display which is an indication of the phase relationship of the conditioned signals.

10. A method as claimed in claim 9 wherein the display is a digital display on an oscilloscope.

11. A method as claimed in claim 10 wherein the digital display is a staircase display, the timing of which is indicative of the phase relationship of the conditioned signals.

* * * * *